United States Patent
Cooper et al.

(10) Patent No.: US 7,837,762 B2
(45) Date of Patent: Nov. 23, 2010

(54) METHOD OF DISTANCING A BUBBLE AND BUBBLE DISPLACEMENT APPARATUS

(75) Inventors: Kevin Cooper, La Terrasse (FR); Scott Warrick, Round Rock, TX (US)

(73) Assignee: Freescale Semiconductor, Inc., Austin, TX (US)

(*) Notice: Subject to any disclaimer, the term of this patent is extended or adjusted under 35 U.S.C. 154(b) by 439 days.

(21) Appl. No.: 11/914,669

(22) PCT Filed: May 17, 2005

(86) PCT No.: PCT/EP2005/006504

§ 371 (c)(1),
(2), (4) Date: Nov. 16, 2007

(87) PCT Pub. No.: WO2006/122577

PCT Pub. Date: Nov. 23, 2006

(65) Prior Publication Data

US 2009/0126565 A1    May 21, 2009

(51) Int. Cl.
*B01D 19/00* (2006.01)
(52) U.S. Cl. ............... 95/28; 95/30; 96/2; 96/175
(58) Field of Classification Search ............ 95/28, 95/30, 57; 96/1, 2, 3, 175
See application file for complete search history.

(56) References Cited

U.S. PATENT DOCUMENTS

| 7,433,016 B2* | 10/2008 | Streefkerk et al. ............ 355/53 |
| 2002/0136971 A1 | 9/2002 | Ito et al. |
| 2005/0048223 A1 | 3/2005 | Pawloski et al. |
| 2006/0216650 A1* | 9/2006 | Harayama .................. 430/311 |

FOREIGN PATENT DOCUMENTS

EP    1486827 A2    12/2004

* cited by examiner

*Primary Examiner*—Duane Smith
*Assistant Examiner*—Douglas J Theisen

(57) ABSTRACT

In the field of immersion lithography, it is known to provide a liquid between an optical exposure system and a wafer carrying layers of photosensitive material to be irradiated with a pattern by the optical exposure system. However, bubbles are known to form or exist in the liquid, sometimes close to a surface of the wafer resulting in scattering of light emitted from the optical exposure system. The scattering causes the pattern recorded in the layers of photosensitive material to be corrupted, resulting in defective wafers. Therefore, the present invention provides a bubble displacement apparatus comprising a drive signal generator for driving a force generator arranged to generate a force in response to a drive signal generated by the drive signal generator. The force generated urges the bubble away from the surface.

13 Claims, 1 Drawing Sheet

METHOD OF DISTANCING A BUBBLE AND BUBBLE DISPLACEMENT APPARATUS

FIELD OF THE INVENTION

This invention relates to a method of distancing a bubble of the type, for example, that resides close to or in contact with a surface, such as a surface of photosensitive material. The present invention also relates to a bubble displacement apparatus.

BACKGROUND OF THE INVENTION

In the field of semiconductor processing, photolithography is a widely employed technique to "pattern", i.e. define a profile in one or more layer of semiconductor material, a semiconductor wafer. Using this technique, hundreds of Integrated Circuits (ICs) formed from an even larger number of transistors can be formed on a wafer of silicon. In this respect, for each wafer, the ICs are formed one at a time and on a layer-by-layer basis.

For about the last four decades, a photolithography apparatus, sometimes known as a cluster or photolithography tool, has been employed to carry out a photolithographic process. The cluster comprises a track unit that prepares the wafer, including providing layers of photosensitive material on the surface of the wafer prior to exposure to a patterned light source. To expose the wafer to the patterned light source, the wafer is transferred to an optics unit that is also part of the cluster. The patterned light source is generated by passing a beam of light through a chrome-covered mask, the chrome having been patterned with an image of a given layer of an IC to be formed, for example, transistor contacts. Thereafter, the wafer is returned to the track unit for subsequent processing including development of the layers of photosensitive material mentioned above.

The wafer, carrying the layers of photosensitive material, is supported by a movable stage. A projection lens focuses the light passing through the mask to form an image on a first field over the layers of photosensitive material where an IC is to be formed, exposing the field of the layers of photosensitive material to the image and hence "recording" the pattern projected through the mask. The image is then projected on another field over the layers of photosensitive material where another IC is to be formed, this field over the layers of photosensitive material being exposed to the projected image, and hence pattern.

The above process is repeated for other fields where other ICs are to be formed. Thereafter, the wafer is, as mentioned above, returned to the track unit, and the exposed layers of photosensitive material, which become soluble or insoluble through exposure depending upon the photosensitive materials used, are developed to leave a "photoresist" pattern corresponding to a negative (or positive) of the image of a layer of one or more ICs to be created. After development, the wafer undergoes various other processes, for example ion implantation, etching or deposition. The remaining layers of photosensitive material are then removed and fresh layers of photosensitive material are subsequently provided on the surface of the wafer depending upon particular application requirements for patterning another layer of the one or more ICs to be formed.

In relation to the patterning process, the resolution of the scanner impacts upon the width of wires and spaces therebetween that can be "printed", the resolution being dependent upon the wavelength of the light used and inversely proportional to a so-called "numerical aperture" of the scanner. Consequently, to be able to define very high levels of detail a short wavelength of light is required and/or a large numerical aperture.

The numerical aperture of the scanner is dependent upon the product of two parameters. A first parameter is the widest angle through which light passing through the lens can be focused on the wafer, and a second parameter is the refractive index of the medium through which the light passes when exposing the layers of photosensitive material on the wafer.

Indeed, to provide the increased resolution demanded by the semiconductor industry, it is known to reduce wavelengths of light used whilst also making lenses bigger to increase the numerical aperture. However, the limits to which the wavelengths of light used can be reduced are rapidly being reached, since wavelengths of less that 157 nm are absorbed by the lenses used.

Additionally, the above-described scanner operates in air, air having a refractive index of 1, resulting in the scanner having a numerical aperture between 0 and 1. Since the numerical aperture needs to be as large as possible, and the amount the wavelength of light can be reduced is limited, an improvement to the resolution of the scanner has been proposed that, other than by increasing the size of the lens, uses the scanner in conjunction with a medium having a refractive index greater than that of air, i.e. greater than 1. In this respect, the more recent photolithographic technique proposed, employing water and known as immersion lithography, can achieve higher levels of device integration than can be achieved by air-based photolithography techniques.

Therefore, scanners employing this improvement (immersion scanners) continue to use low wavelengths of light, but the water provides a refractive index of 1.4 between the lens and the wafer, thereby achieving increased resolution through increasing the numerical aperture of the immersion lithographic apparatus by a factor of 1.4.

Further, the refractive index of the water is very close to that of fused silica from which some lenses are formed, resulting in reduced refraction at the interface between the lens and the water. The reduced refraction allows the size of the lens to be increased, thereby increasing the numerical aperture further.

Whilst it appears that immersion lithography can achieve wafer throughputs comparable to air lithography, difficulties exist when introducing water between the lens and the wafer. One way of placing water between the lens and the wafer involves injecting a small film of water between the wafer and the lens, the film covering a field over the surface of the layers of photosensitive material where a given IC is to be formed, rather than the entire wafer.

However, by placing water between the lens and the wafer, and indeed in contact with an uppermost surface of the layers of photosensitive material, defects can be introduced. Such defects, or contaminants, when in the focal plane of the optics unit (sometimes known as a "scanner") affect the ability of an immersion lithography apparatus to print defect-free lines and spaces. In this respect, defect levels can be affected by particle impurities in the water, temperature variations of the water, and thickness uniformity of the water layer. Additionally, bubbles can form in the water layer, which can scatter the light from the lens, causing blurring and distortion of the projected image. Possible sources of bubbles are air dissolved in the water, air introduced into the water as it is ejected from nozzles, air introduced through turbulence caused by movement of a stage or projection system, and/or "out gassing", the egress of gas from the photosensitive material as a result of impurities or simply the components of the photosensitive material. Whilst so-called "degasification" can remove bubbles caused by air dissolved into the water and careful nozzle design can eliminate the nozzle-induced bubbles, air trapped on the uppermost surface of the layers of photosensitive material can also create bubbles as the water flows over the surface of the wafer.

One proposed solution to avoid imaging problems caused by bubbles adjacent the surface of the wafer is to apply a top anti-reflection coating over the layers of photosensitive material prior to placing the wafer in the immersion lithography apparatus, thereby creating a barrier between bubbles and the uppermost surface of the layers of the photosensitive material. However, such a solution, whilst keeping bubbles further from the focal plane, i.e. the uppermost surface of the layers of photosensitive material, serves to increase the focal distance and hence reduce the resolution that can be achieved.

STATEMENT OF INVENTION

According to the present invention, there is provided a bubble displacement apparatus and a method of distancing a bubble as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
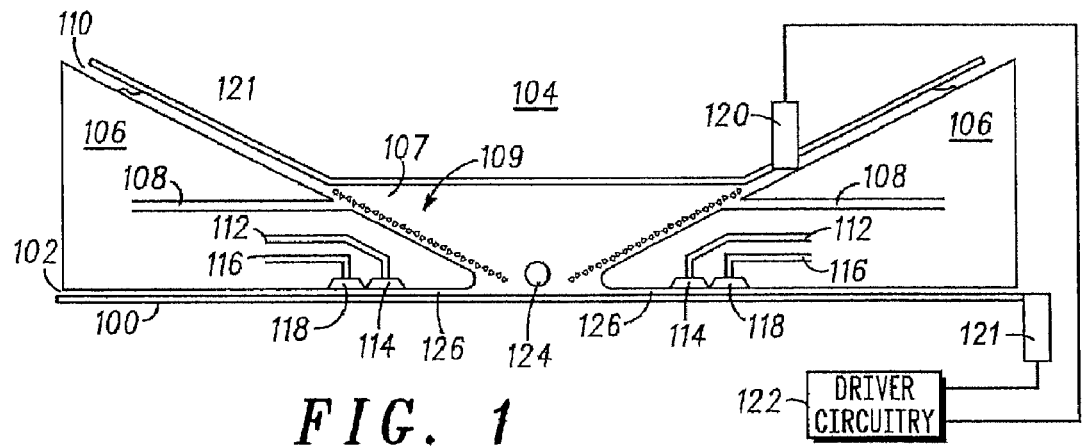
FIG. 1 is a schematic diagram of a bubble displacement apparatus constituting a first embodiment of the invention.

Throughout the following description identical reference numerals will be used to identify like parts.

Referring to FIG. 1, a semiconductor wafer 100 having layers of photosensitive material disposed thereon, the layers of photosensitive material having an upper surface 102, is disposed upon a substrate stage (not shown) of an immersion lithography apparatus. In this example, the immersion lithography apparatus is a modified TWINSCANT™ XT:1250i lithography scanner available from ASML. The lithography scanner is a complex apparatus having many parts, the structure and operation of which, are not directly relevant to the embodiments disclosed herein. Consequently, for the sake of clarity and conciseness of description, only the parts of the lithography scanner of particular relevance to the embodiments herein will be described.

The immersion lithography apparatus comprises an optical exposure (projection or catadioptric) system 104 connected to a liquid supply system 106, sometimes known as a "showerhead". Liquid 107 is disposed between the bottom of the optical exposure system 104 and the surface 102 of the layers of photosensitive material.

The liquid supply system 106 comprises water inlet/outlet ports 108 in fluid communication with a reservoir 109 defined by an inner peripheral surface 110 of the liquid supply system 106 and the upper surface 102. A vacuum pump (not shown) is coupled to vacuum ports 112, the vacuum ports 112 being in fluid communication with a first channel loop 114. A compressor (not shown) is coupled to air supply ports 116, the air supply ports 116 being in fluid communication with a second channel loop 118.

A first electrode 120, for example a copper electrode, is coupled to the liquid supply system 106 so that the first electrode 120 is in contact with the liquid 107, and a second electrode 121, for example also a copper electrode, is coupled to a peripheral edge of the surface 102 of the wafer 100, and hence the photosensitive materials. The first and second electrodes 120, 121 are coupled to a driver circuit 122. In this example, although not shown in FIG. 1, the second electrode comprises a number of circumferentially spaced electrical contacts to provide a uniform charge across the surface 102 of the wafer 100.

In operation, at least one bubble 124 is disposed within the liquid 107 and in close proximity to the surface 102 of the layers of photosensitive material. The optical exposure system 104 coupled to the liquid supply system 106 scans the surface 102 of the layers of photosensitive material in order to project a pattern onto the layers of photosensitive material in a manner known for the lithography scanner. A vacuum provided to the first channel loop 114 via the vacuum ports 112 and pressurised air expelled into the second channel loop 118 via the air supply ports 116 prevent egress of the liquid 107 from the reservoir 109 through a clearance 126 between the liquid supply system 106 and the surface 102, thereby serving as a seal and a means of preventing spurious deposition of the liquid 107 on the surface 102.

The proximity of the bubble 124 to the surface 102 will result in scattering of light emitted from the optical exposure system 104. However, a charge, in this example negative, inherently surrounds the bubble 124 and so the driver circuit 122 generates a substantially continuous positive driver signal that is applied to the electrode 120. The positive charge at the electrode 120 serves to electrostatically attract the negatively charged bubble 124 to the housing of the liquid supply system 106, thereby causing the bubble 124 to move away from the surface 102 and hence the bubble 124 is distanced from the surface 102.

In this example, the driver circuit 122 generates the continuous positive voltage signal. However, it should be appreciated that other signals can be generated by the driver circuit 122, for example a continuous negative signal. Alternatively, the driver signal can be a time-varying signal, for example a modulated signal or a pulsed signal. In all cases, an electrostatic force is used to urge the bubble 124 away from the surface 102. Of course, the skilled person will appreciate that the first electrode 120 can be disposed within the liquid 107 at positions, which urge the bubble 124 laterally out of the field.

Figure 2:
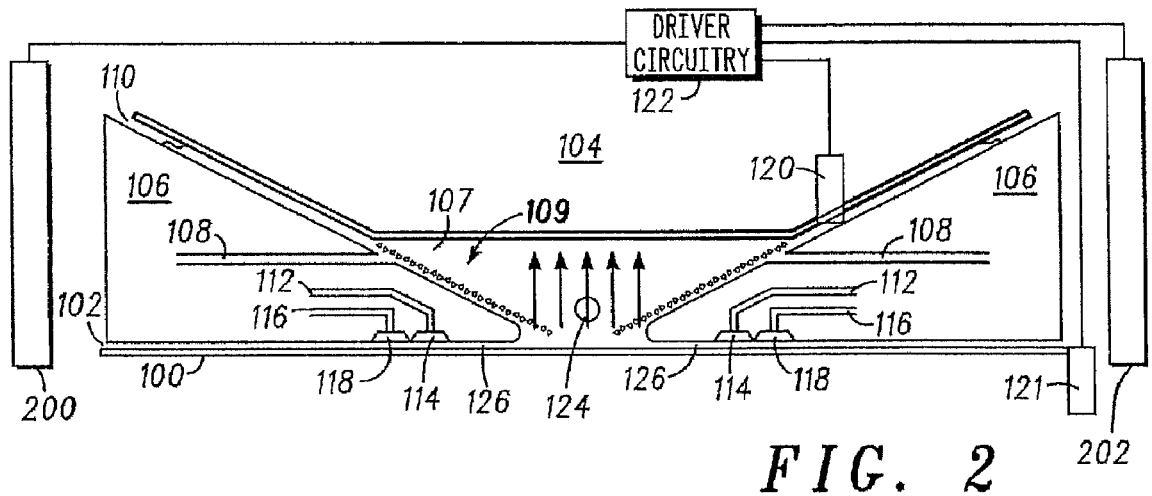
FIG. 2 is a schematic diagram of another bubble displacement apparatus constituting a second embodiment of the invention.

In another embodiment (FIG. 2), another type of force is used to urge the bubble 124 away from the surface 102 of the layers of photosensitive material. A first electromagnet 200 and a second electromagnet 202 are therefore coupled to the driver circuit. However, in order to enable the first and second electromagnets 200, 202 to mechanically influence the bubble 124, the bubble 124 is subjected to an initial additional force, for example by an electrostatic field created by the first and second electrodes 120, 121 described above, although alternative mechanisms can be employed to create the initial movement of the bubble 124. The first and second electromagnets 200, 202 are arranged either side of the immersion lithography apparatus with opposite poles facing each other so that, when energised, a magnetic field can be generated across the reservoir 109.

In operation, the driver circuit 122 generates a driver signal to cause the first and second electromagnets to generate a substantially continuous, and optionally uniform magnetic field therebetween and across the reservoir 109.

When the first and second electromagnets 200, 202 are energised, the negatively charged bubble 124 is urged, by the magnetic field generated, away from the surface 102 of the layers of photosensitive material.

In this example, the driver signal is generated so that a continuous field is generated between the first and second electromagnets 200, 202 in one direction. However, it should be appreciated that other signals can be generated by the driver circuit 122 so that, for example, the continuous field can be generated in an opposite direction to that described above. Alternatively, the driver signal can be a time-varying signal, for example a modulated signal or a pulsed signal, resulting in a corresponding magnetic field being generated between the first and second electromagnets 200, 202. In all cases, a magnetic force is used to continue moving the bubble 124 away from the field at the surface 102. Of course, the skilled person will again appreciate that the first and second electromagnets 200, 202 can be disposed about the liquid supply system 106 so as to urge the bubble 124 laterally out of the field.

Figure 3:
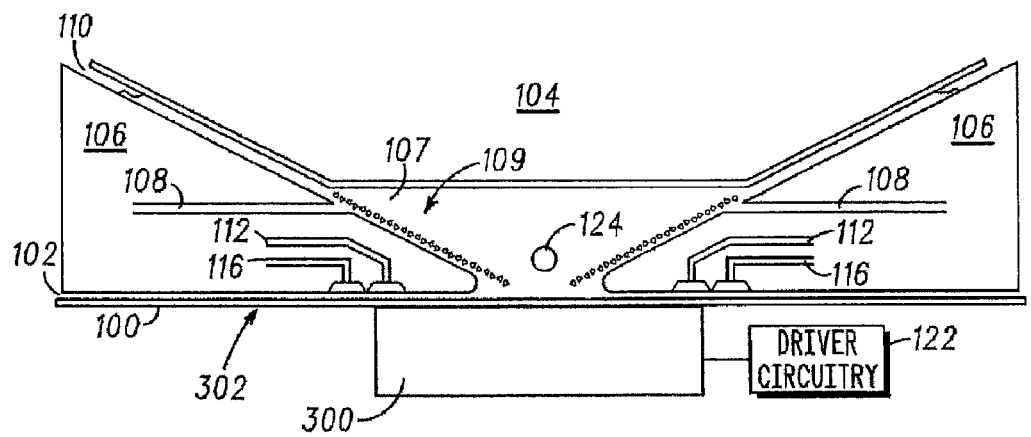
FIG. 3 is a schematic diagram of further bubble displacement apparatus constituting a third embodiment of the invention.

In a further embodiment (FIG. 3), yet another type of force is used to urge the bubble 124 away from the surface 102 of the layers of photosensitive material. In this respect, instead of coupling the electrode 120 or the first and second electromagnets 200, 202 to the driver circuit 122, a piezoelectric transducer 300 is coupled to an underside 302 of the wafer 100, the piezoelectric transducer 300 being electrically coupled to the driver circuit 122.

In operation, the driver circuit 122 generates a time-varying signal, the time-varying signal being, in this example, a modulated signal, although the skilled person will appreciate that other time-varying signals can be employed, such as a pulse signal. The time-varying signal is of a predetermined amplitude and/or frequency, resulting in the piezoelectric transducer 300 generating acoustic waves in the liquid 107 corresponding to the form of the time-varying signal. In this example, the amplitude and/or frequency of the time-signal is sufficient to urge the bubble 124 away from the surface 102 of the layers of photosensitive material by the application of a mechanical force on the bubble 124 by the acoustic waves in the liquid 107.

In yet a further embodiment, the amplitude and/or frequency of the time-varying signal is sufficiently great to cause the bubble 124 to break-up into a number of smaller bubbles (not shown), the number of bubbles created being sufficiently small such that the proximity of the number of bubbles created to the surface 102 does not result in scattering of light emitted from the optical exposure system 104. In this respect, the skilled person will appreciate that the intensity and/or profile of the waveform used to disperse the bubble 124 depends upon a number of parameters, for example size of the bubble 124, volume of the medium in which the bubble 124 is disposed (in this example, the liquid 107), flow rate of the medium and/or concentration of bubbles, where more than one bubble is being dispersed.

Although the above two embodiments employ a piezoelectric transducer, it should be appreciated that any device capable of generating acoustic waves in the liquid 107 can be employed.

Throughout the description, reference has been made herein to the bubble 124. However, the skilled person will understand that more than one bubble can exist in the liquid 107. In the present description, a single bubble has only been described for the purpose of preserving simplicity of description.

Although not explicitly described above, the skilled person will appreciate that any combination of the above described ways of generating forces for moving the bubble 124 can be employed.

Although reference to "scanners" (Step and Scan Systems) is made herein, the skilled person will appreciate that alternative optical exposure systems can be employed, for example a so-called "stepper" (step and repeat) in which a reticle passes between a light source and a lens system.

It is thus possible to provide a bubble displacement apparatus and a method of displacing bubbles that permits immersion lithography to be a viable lithographic technique, reducing occurrences of defects and providing a wider range of photolithographic process parameters than available to existing photolithographic tools. Consequently, higher yields of wafers can be produced.

The invention claimed is:

1. A bubble displacement apparatus for distancing a bubble in a fluid from a surface in an immersion optical exposure system, the apparatus comprising:
   a drive signal generator arranged to generate, when in use, a drive signal; and
   a force generator coupled to the drive signal generator;
   wherein the force generator is arranged, when in use, to apply at least one force for urging the bubble away from the surface, the force generator being arranged to generate at least one field, and the at least one field is a magnetic field.

2. An apparatus as claimed in claim 1, wherein the at least one field is an electric field.

3. An apparatus as claimed in claim 1, wherein the force generator is arranged to generate at least an acoustic wave.

4. An apparatus as claimed in claim 1, wherein the drive signal is a time-varying signal.

5. An apparatus as claimed in claim 4, wherein the time varying signal is a modulated signal.

6. An apparatus as claimed in claim 4, wherein the time-varying signal is a pulsed signal.

7. A method of distancing a bubble in a fluid from a surface for irradiation by an immersion optical exposure system, the method comprising the steps of:
   generating a drive signal;
   generating a magnetic field so as to provide a force in response to the drive signal, thereby urging the bubble away from the surface.

8. An apparatus as claimed in claim 2, wherein the drive signal is a time-varying signal.

9. An apparatus as claimed in claim 3, wherein the drive signal is a time-varying signal.

10. A method as claimed in claim 7, further comprising generating an acoustic wave.

11. A method as claimed in claim 7, wherein the drive signal is a time-varying signal.

12. A method as claimed in claim 11, wherein the time varying signal is a modulated signal.

13. A method as claimed in claim 11, wherein the time-varying signal is a pulsed signal.

* * * * *